(12) United States Patent
Bae et al.

(10) Patent No.: US 11,579,199 B2
(45) Date of Patent: Feb. 14, 2023

(54) APPARATUS FOR VERIFYING ELECTRICAL CONNECTIVITY

(71) Applicant: Samsung SDI Co., Ltd., Yongin-si (KR)

(72) Inventors: Jeongguk Bae, Yongin-si (KR); Giho Seo, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 939 days.

(21) Appl. No.: 16/418,921

(22) Filed: May 21, 2019

(65) Prior Publication Data

US 2019/0363558 A1 Nov. 28, 2019

(30) Foreign Application Priority Data

May 25, 2018 (KR) .................. 10-2018-0059581

(51) Int. Cl.
*G01R 31/36* (2020.01)
*H02J 7/00* (2006.01)
*H01M 50/20* (2021.01)

(52) U.S. Cl.
CPC ............ *G01R 31/36* (2013.01); *H01M 50/20* (2021.01); *H02J 7/0045* (2013.01)

(58) Field of Classification Search
CPC ........ H02J 7/0045; H02J 7/007; H01M 50/20; G01R 31/36
See application file for complete search history.

(56) References Cited

U.S. PATENT DOCUMENTS

| 8,824,113 B2 | 9/2014 | Casey |
| 9,638,758 B2 | 5/2017 | Wickert et al. |
| 10,199,921 B2 | 2/2019 | Chung et al. |

(Continued)

FOREIGN PATENT DOCUMENTS

| KR | 10-2014-0062534 A | 5/2014 |
| KR | 10-2015-0115663 A | 10/2015 |

(Continued)

OTHER PUBLICATIONS

EPO Extended Search Report dated Nov. 18, 2019, for corresponding European Patent Application No. 19176417.4 (5 pages).

(Continued)

*Primary Examiner* — Richard V Muralidar
(74) *Attorney, Agent, or Firm* — Lewis Roca Rothgerber Christie LLP

(57) ABSTRACT

An apparatus for verifying electrical connectivity between a first device and a second device includes: a signal generator configured to generate a first signal having a voltage waveform. under control of a processor; a second device connector configured to transmit the first signal to the second device and acquire a second signal output from the second device in response to the first signal; a processor connector configured to transmit the first and second signals to the processor; a current controller configured to control a magnitude of current such that the first signal has a given current value; and the processor configured to verify the electrical connectivity between the first and second devices based on the first and second signals received through the processor connector.

10 Claims, 4 Drawing Sheets

(56) References Cited

U.S. PATENT DOCUMENTS

| | | |
|---|---|---|
| 2007/0216356 A1 | 9/2007 | Kamatani |
| 2009/0237035 A1 | 9/2009 | Kung et al. |
| 2010/0182155 A1 | 7/2010 | Ju et al. |
| 2013/0006418 A1* | 1/2013 | Tian .................. H02J 7/00036 700/245 |
| 2014/0292261 A1* | 10/2014 | Wang ..................... B60L 58/00 320/137 |
| 2015/0309118 A1 | 10/2015 | Jeon |
| 2016/0069945 A1 | 3/2016 | Lachaize |
| 2016/0156290 A1 | 6/2016 | Xu et al. |
| 2016/0238665 A1 | 8/2016 | Kleppe |
| 2017/0005500 A1* | 1/2017 | Zhang ....................... H02J 7/02 |
| 2017/0317513 A1* | 11/2017 | King .................... B60L 53/305 |

FOREIGN PATENT DOCUMENTS

| | | |
|---|---|---|
| KR | 10-2016-0050365 A | 5/2016 |
| KR | 10-1836740 B1 | 3/2018 |

OTHER PUBLICATIONS

Korean Notice Of Allowance dated Jun. 24, 2022, issued in corresponding Korean Patent Application No. 10-2018-0059581 (2 pages).

\* cited by examiner

| FIRST SIGNAL | SECOND SIGNAL | ELECTRICAL CONNECTIVITY |
|---|---|---|
| ⊓⊓⊓⊓ H / L | ⊓⊓⊓⊓ H / L | VERIFIED |
| ⊓⊓⊓⊓ H / L | ─── H / ─── L | OPENED OR SHORTED TO GROUND |
| ⊓⊓⊓⊓ H / L | ─── H / ─── L | SHORTED TO POWER SUPPLY |
| ─── H / ─── L | ─── H / ─── L | OPENED OR SHORTED TO GROUND |
| ─── H / ─── L | ─── H / ─── L | SHORTED TO POWER SUPPLY |

APPARATUS FOR VERIFYING ELECTRICAL CONNECTIVITY

CROSS-REFERENCE TO RELATED APPLICATION

This application claims priority to and the benefit of Korean Patent Application No. 10-2018-0059581, filed on May 25, 2018, in the Korean Intellectual Property Office, the disclosure of which is incorporated herein in its entirety by reference.

BACKGROUND

1. Field

Aspects of one or more embodiments relate to an apparatus for verifying electrical connectivity.

2. Description of the Related Art

With the development of electric vehicles, energy storage device technology, and the like, technologies relating to battery packs have advanced, and there is a trend toward designing battery packs having higher operating voltage and capacity for driving such devices.

As described above, because battery packs are designed to have high voltage and capacity, it has become more important to verify whether the electrical connection between a battery pack and a device is complete.

The above information disclosed in this Background section is only for enhancement of understanding of the background of the invention and therefore it may contain information that does not constitute prior art.

SUMMARY

Aspects of one or more example embodiments include an apparatus for securely verifying the electrical connectivity between two electronic devices to be coupled to each other.

Aspects of one or more example embodiments include an apparatus for securely verifying the electrical connectivity between two devices while preventing or reducing instances of a signal used for the verification being distorted by noise generated from at least one of the two devices.

Aspects of one or more example embodiments include an apparatus configured to be manufactured with lower costs for verifying electrical connectivity.

Additional aspects will be set forth in part in the description which follows and, in part, will be more apparent from the description, or may be learned by practice of the example embodiments.

According to aspects of one or more example embodiments, in an apparatus for verifying electrical connectivity between a first device and a second device, the apparatus includes: a signal generator configured to generate a first signal having a voltage waveform. under control of a processor; a second device connector configured to transmit the first signal to the second device and acquire a second signal output from the second device in response to the first signal; a processor connector configured to transmit the first and second signals to the processor; a current controller configured to control a magnitude of current such that the first signal has a given current value; and the processor configured to verify the electrical connectivity between the first and second devices based on the first and second signals received through the processor connector.

When the first and second signals received through the processor connector correspond to each other, the processor may determine that the electrical connectivity between the first and second devices is verified.

The first signal may be a square-wave signal having a given period, and when the second signal is a square-wave signal having the given period, the processor may determine that the electrical connectivity between the first and second devices is verified.

The first signal may be at least one of a square-wave signal having a given period and a linear signal having only a power supply voltage, and when the second signal is a linear signal having only a ground voltage, the processor may determine that the first and second devices are in one of a state in which the first and second devices are electrically opened and a state in which the second device is shorted to ground.

The first signal may be a square-wave signal having a given period, and when the second signal is a linear signal having only a power supply voltage, the processor may determine that the second device is shorted to a power supply.

The second device connector may include: a signal transmission unit configured to transmit the first signal to the second device; and a signal acquisition unit configured to acquire the second signal from the second device.

The second device may form a first closed circuit having the signal transmission unit and the signal acquisition unit as a start point and an end point, respectively, and the first signal may be transmitted through a second closed circuit in which the signal generator, the signal transmission unit, the first closed circuit, the signal acquisition unit, and the current controller are connected in series to each other.

When the first signal is transmitted through the second closed circuit, the current controller may adjust a current value in the second closed circuit to be equal to the given current value.

When the first signal is transmitted through the second closed circuit, the given current value may be greater than a current value caused by noise.

The first device may be a battery pack, and the second device may be an electronic device configured to be driven by the battery pack, wherein the apparatus may be connected in parallel to the first device and in series to the second device through the second device connector.

Before the first device is connected to the second device, the apparatus may be connected in series to the second device through the second device connector and may verify the electrical connectivity between the first and second devices.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
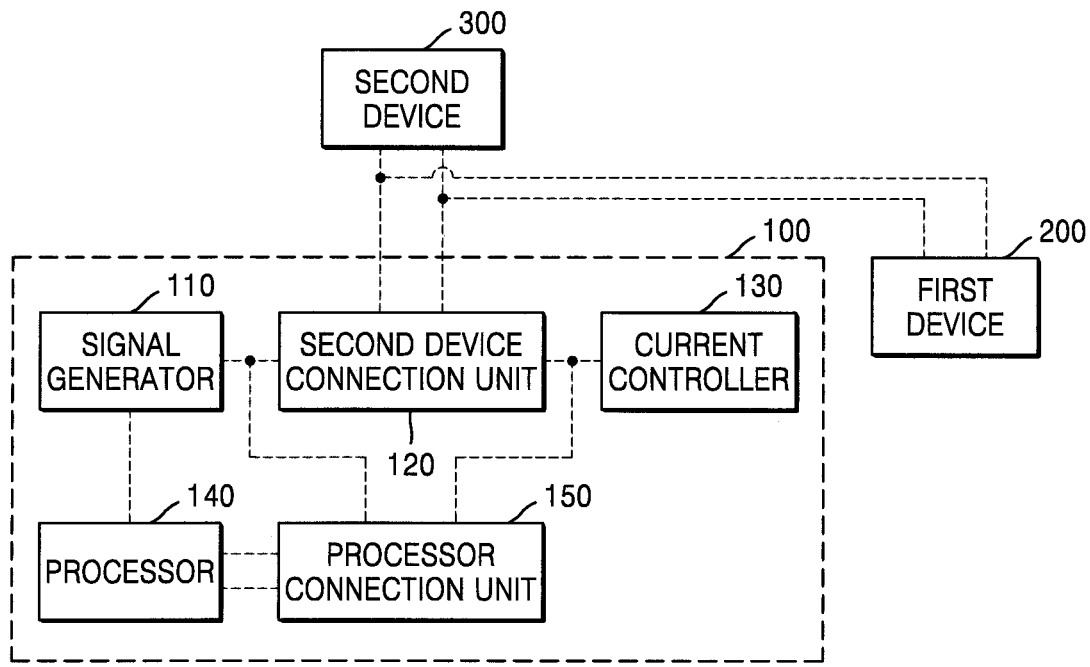
FIG. 1 is a view illustrating a configuration of an apparatus for verifying electrical connectivity, according to some example embodiments of the present invention.

Reference will now be made in more detail to aspects of some example embodiments, which are illustrated in the accompanying drawings. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Aspects and features of the present disclosure, and implementation methods thereof will be clarified through the following descriptions given with reference to the accompanying drawings. However, the following embodiments of the present disclosure are non-limiting examples and may have different forms, and it should be understood that the idea and technical scope of the present disclosure cover all the modifications, equivalents, and replacements. Rather, these example embodiments are provided so that this disclosure will be more thorough and more complete, and will more fully convey the scope of the present disclosure to those skilled in the art. Moreover, detailed descriptions related to well-known functions or configurations will be omitted in order not to unnecessarily obscure subject matter of the present disclosure.

For example, specific shapes, structures, and features described with respect to one example embodiment may be modified in another example embodiment without departing from the scope of the present disclosure. In addition, the positions or arrangement of elements described in one example embodiment may be changed in another example embodiment within the scope of the present disclosure. That is, the following description is provided for illustrative purposes only and is not intended to limit the scope of the present disclosure. The scope of the present disclosure is defined by the claims and equivalents thereof. In the drawings, like reference numerals denote like elements. Details described in the present disclosure are examples. That is, such details may be changed in other example embodiments within the spirit and scope of the present disclosure.

It will be understood that although the terms "first," "second," etc. may be used herein to describe various elements, these elements should not be limited by these terms. These terms are only used to distinguish one element from another.

The terminology used herein is for explaining specific embodiments only and is not intended to limit the scope of the present disclosure. The terms of a singular form may include plural forms unless otherwise mentioned. It will be understood that terms such as "comprise," "include," and "have," when used herein, specify the presence of state features, integers, steps, operations, elements, components, or combinations thereof, but do not preclude the presence or addition of one or more other features, integers, steps, operations, elements, components, or combinations thereof.

Hereinafter, aspects of some example embodiments will be described in more detail with reference to the accompanying drawings. In the drawings, like reference numerals denote like elements, and overlapping descriptions thereof will be omitted.

FIG. 1 is a view illustrating a configuration of an apparatus 100 for verifying electrical connectivity according to some example embodiments.

The apparatus 100 for verifying electrical connectivity according to some example embodiments may verify the electrical connectivity between a first device 200 and a second device 300. For example, when the first device 200 is a battery pack and the second device 300 is an electronic device configured to be driven by the battery pack, the apparatus 100 for verifying electrical connectivity may verify the electrical connectivity between the first device 200 and the second device 300 before the first device 200 (battery pack) is turned on, to prevent accidents that may occur as the first device 200 and the second device 300 are connected to each other.

As shown in FIG. 1, the apparatus 100 for verifying electrical connectivity may include a signal generator 110, a second device connection unit (or second device connector) 120, a current controller 130, a processor 140, and a processor connection unit (or processor connector) 150.

In addition, the apparatus 100 for verifying electrical connectivity according to some example embodiments may be electrically connected to the first and second devices 200 and 300 to verify the electrical connectivity between the first and second devices 200 and 300. For example, as shown in FIG. 1, the apparatus 100 for verifying electrical connectivity may be connected in parallel to the first device 200 and in series to the second device 300.

According to some example embodiments, the signal generator 110 may generate a first signal having a given voltage waveform under the control of the processor 140 (described in more detail below). At this time, the first signal generated by the signal generator 110 may be transmitted through a closed circuit formed by the apparatus 100 for verifying electrical connectivity and the second device 300. The closed circuit will be described in more detail below.

Figures 3, 4:
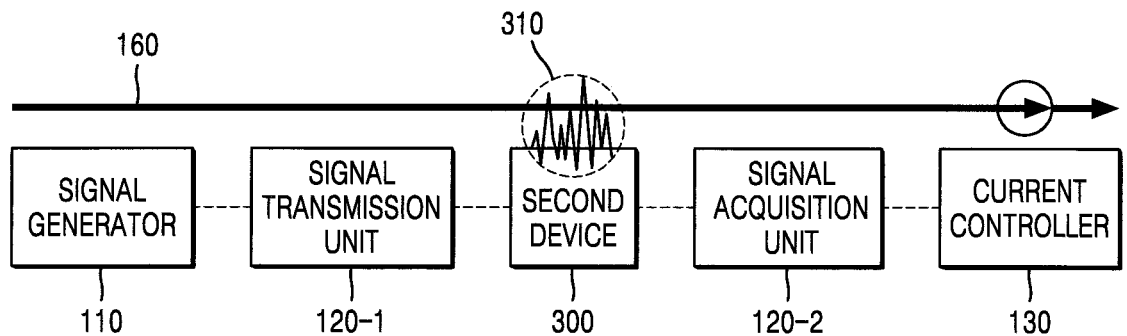
FIG. 4 is a view illustrating example results of determination of the electrical connectivity between two devices according to types of first and second signals.

In addition, the signal generator 110 may generate first signals having various voltage waveforms under the control of the processor 140 (described in more detail below). For example, as shown in FIG. 4, the signal generator 110 may generate a square-wave signal having a given period, or a linear signal having only a power supply voltage or ground voltage. However, the above-described forms of first signals are examples, and embodiments according to the present disclosure are not limited thereto.

The second device connection unit 120 of the embodiment may transmit a first signal generated by the signal generator 110 to the second device 300 and may acquire a second signal output from the second device 300 in response to the first signal. To this end, the second device connection unit 120 according to some example embodiments may include: a signal transmission unit 120-1 (refer to FIG. 3) configured to transmit a first signal generated by the signal generator 110 to the second device 300; and a signal acquisition unit 120-2 (refer to FIG. 3) configured to acquire a second signal output from the second device 300 in response to the first signal.

The processor connection unit 150 according to some example embodiments may transmit the first signal and the second signal to the processor 140. For example, the first and second signals transmitted to the processor 140 through the processor connection unit 150 may be used to check the electrical connectivity between the first device 200 and the second device 300.

The current controller 130 of the embodiment may operate such that the first signal having a voltage waveform and transmitted through the closed circuit formed by the apparatus 100 for verifying electrical connectivity and the second device 300 may have a current value.

In the related art, when the electrical connectivity between the first device 200 and the second device 300 are verified, only the voltage of the signal is considered, and thus the electrical connectivity between the first device 200 and the second device 300 may not be properly verified due to the influence of noise.

However, according to some example embodiments according to the present disclosure, the apparatus 100 for verifying electrical connectivity uniformly controls even the current value of the first signal having a given voltage waveform. Therefore, the influence of noise may be reduced, and thus the electrical connectivity between two devices may be more reliably verified.

The processor 140 of the embodiment may check the electrical connectivity between the first device 200 and the second device 300 based on the first signal and the second signal transmitted through the processor connection unit 150. For example, when the first signal and the second signal transmitted through the processor connection unit 150 correspond to each other, the processor 140 may determine that the electrical connectivity between the first device 200 and the second device 300 is verified. In this case, the expression "two signals 'correspond to' each other" may mean that the two signals are identical to each other or are within the range in which the two signals are considered to be identical to each other.

The processor 140 may control the voltage waveform of the first signal generated by the signal generator 110 as described above.

For example, the processor 140 may refer to a data processing device included in hardware and having a physically structured circuit to execute codes of programs or functions expressed with instructions. Examples of the data processing device included in hardware may include a microprocessor, a central processing unit (CPU), a processor core, a multiprocessor, an application-specific integrated circuit (ASIC), and a field programmable gate array (FPGA). However, embodiments are not limited thereto.

According to some example embodiments, the processor 140 may be a device included in the first device 200. For example, the first device 200 may be a battery pack, and the processor 140 may be a device included in a battery management system (BMS) of the battery pack or may be the BMS. However, this is an example, and embodiments are not limited thereto.

Figure 2:
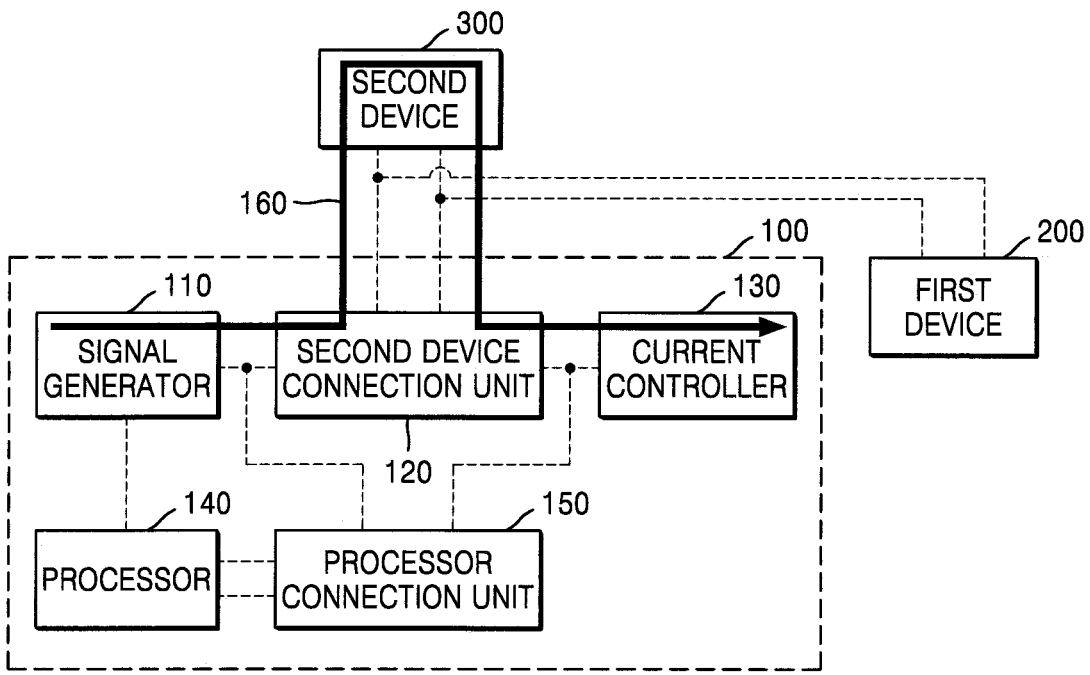
FIGS. 2 and 3 are views illustrating a closed circuit formed by the apparatus for verifying electrical connectivity and a second device, according to some example embodiments of the present invention.

FIGS. 2 and 3 are views illustrating a closed circuit 160 formed by the apparatus 100 for verifying electrical connectivity and the second device 300 according to some example embodiments.

As described above, a first signal generated by the signal generator 110 may be transmitted to the second device 300 through the second device connection unit 120, and a second signal output from the second device 300 in response to the first signal may be transmitted back to the apparatus 100 for verifying electrical connectivity through the second device connection unit 120.

In other words, the first signal may be transmitted through the closed circuit 160 formed by the signal generator 110, the second device connection unit 120, and the second device 300. For example, the current controller 130 placed in the closed circuit 160 may maintain the magnitude of current of the first signal at a constant level in the closed circuit 160.

This will now be described in more detail with reference to FIG. 3. The first signal may be transmitted through the closed circuit 160 formed by the signal generator 110, the signal transmission unit 120-1 of the second device connection unit 120, the second device 300, the signal acquisition unit 120-2 of the second device connection unit 120, and the current controller 130.

For example, the current controller 130 may maintain the magnitude of current of the first signal such that the current value of the first signal may less affected by noise 310 generated in the second device 300, and thus the electrical connectivity between the first and second devices 200 and 300 may be more reliably verified.

FIG. 4 illustrates example results of determination of the electrical connectivity between the first and second devices 200 and 300 according to types of first and second signals.

As described above, when first and second signals received through the processor connection unit 150 correspond to each other, the processor 140 may determine that the electrical connectivity between the first device 200 and the second device 300 is verified. In this case, the expression "two signals 'correspond to' each other" may mean that the two signals are identical to each other or are within the range in which the two signals are considered to be identical to each other.

When the first signal is a square-wave signal having a given period and the second signal is also a square-wave signal having the same period as the first signal, the processor 140 may determine that the electrical connectivity between the first device 200 and the second device 300 is verified.

However, when the first signal is a square-wave signal having a given period but the second signal is a linear signal having only a ground voltage, the processor 140 may determine this situation as one of the state in which the first device 200 and the second device 300 are electrically opened and the state in which the second device 300 is shorted to ground.

In addition, similarly, when the first signal is a square-wave signal having a given period but the second signal is a linear signal having only a power supply voltage, the processor 140 may determine that the second device 300 is shorted to a power supply. For example, the ground voltage may refer to one of ground voltage and reference voltage, and the power supply voltage may refer to the voltage of the power supply used to drive the first device 200 and/or the apparatus 100.

In addition, when the first signal is a linear signal having only the power supply voltage and the second signal is a linear signal having only the ground voltage, the processor 140 may determine this situation as one of the state in which the first device 200 and the second device 300 are electrically opened and the state in which the second device 300 is shorted to ground.

Conversely, when the first signal is a linear signal having only the ground voltage and the second signal is a linear signal having only the power supply voltage, the processor 140 may determine that the second device 300 is shorted to the power supply.

In this manner, the processor 140 of the embodiment may variously verify the electrical connectivity between the first and second devices 200 and 300 based on first and second signals.

Figure 5:
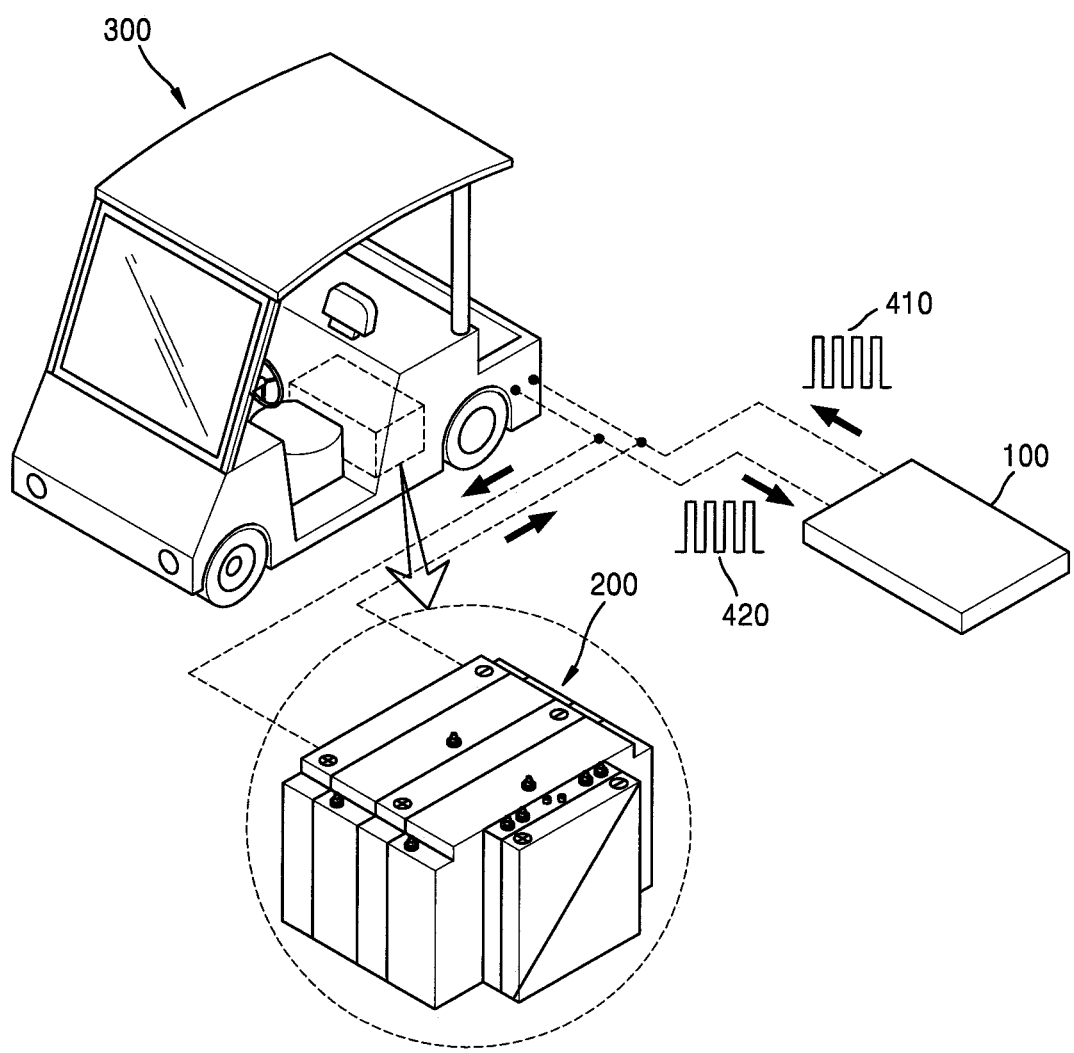
FIG. 5 is view illustrating examples of first and second devices according to some example embodiments of the present invention.

FIG. 5 is view illustrating examples of the first device 200 and the second device 300 according to some example embodiments.

As shown in FIG. 5, for example, the first device 200 may be a battery pack, and the second device 300 may be a cart configured to be driven by the battery pack.

For example, before the first device 200 is connected to the second device 300, the apparatus 100 for verifying electrical connectivity may be connected in series to the second device 300 to verify the electrical connectivity between the first device 200 and the second device 300.

In other words, the apparatus 100 for verifying electrical connectivity may transmit a first signal 410 to the second device 300 and may acquire a second signal 420 output from the second device 300 in response to the first signal 410 to verify the electrical connectivity between the first and second devices 200 and 300 by comparing the first and second signals 410 and 420.

Furthermore, in the present disclosure, the expression "before the first device 200 is connected to the second device 300" may mean that in a state in which wiring for connecting the first device 200 and the second device 300 to each other is set up as shown in FIG. 5, the first device 200 and the second device 300 are not yet electrically connected to each other because an internal switch of the first device 200 is turned off.

Figure 6:
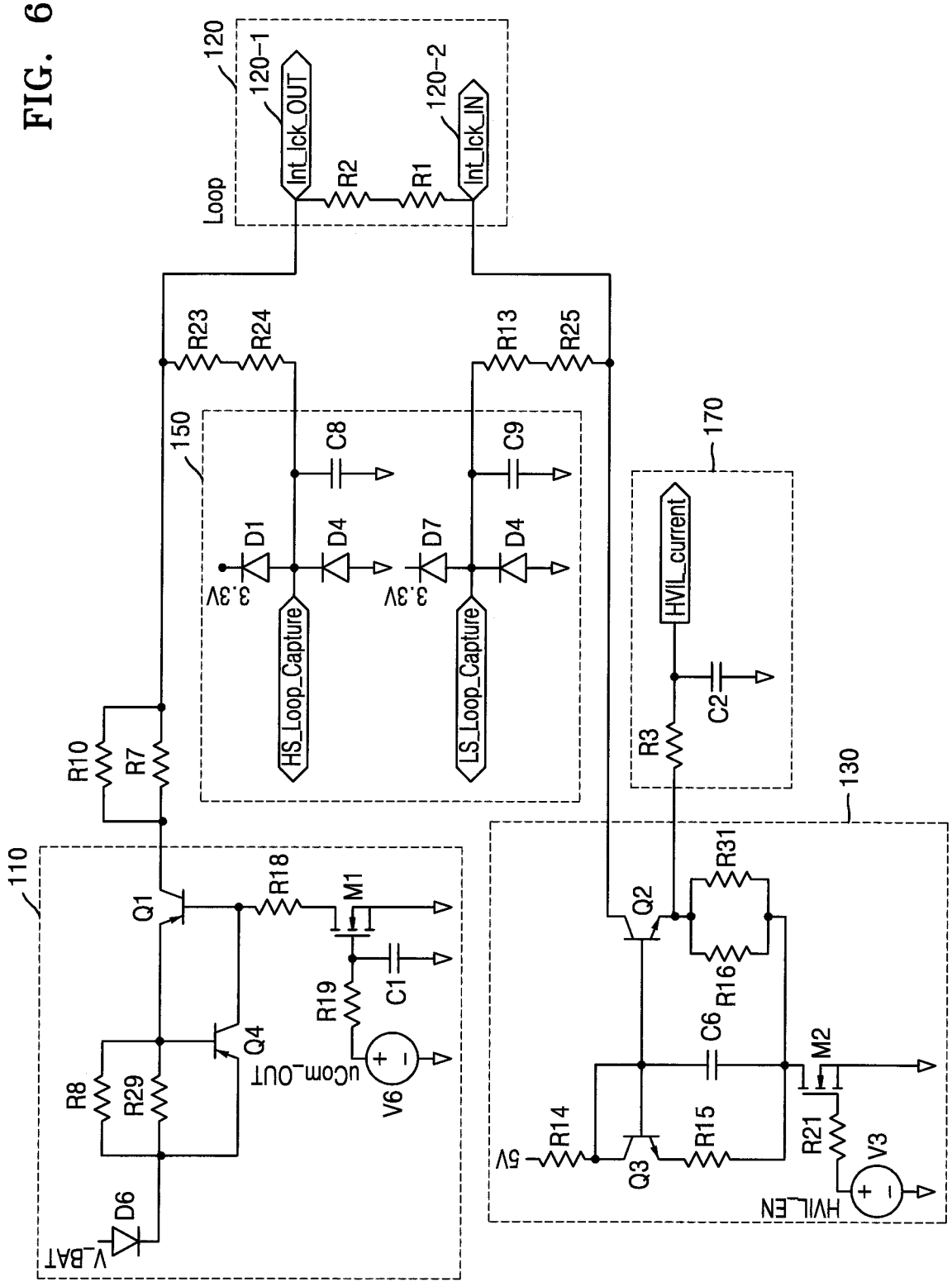
FIG. 6 is a view illustrating an example of the apparatus for verifying electrical connectivity, according to some example embodiments of the present invention.

FIG. 6 is a view illustrating an example of the apparatus 100 for verifying electrical connectivity according to some example embodiments.

As described above, the apparatus 100 for verifying electrical connectivity may include: a signal generator 110 configured to generate a first signal having a given voltage waveform under the control of a processor 140 (refer to FIG. 1); a second device connection unit 120 configured to transmit the first signal to a second device 300 (refer to FIG. 1) and acquire a second signal output from the second device 300 in response to the first signal; a processor connection unit 150 configured to transmit the first and second signals to the processor 140 (refer to FIG. 1); a current controller 130 configured to control the magnitude of current of the first signal such that the first signal may have a given current value; and a current monitoring unit 170 configured to deliver the current value controlled by the current controller 130 to the processor 140.

For example, as described above, the second device connection unit 120 may include a signal transmission unit 120-1 configured to transmit the first signal to the second device 300 (refer to FIG. 1), and a signal acquisition unit 120-2 configured to acquire the second signal from the second device 300 (refer to FIG. 1).

As described above, according to some example embodiments, when two electronic devices are coupled, the electrical connectivity between the two electronic devices may be more securely verified.

For example, according to some example embodiments of the present disclosure, when a signal having a voltage waveform is used for verifying the electrical connectivity between two devices, even the current value of the signal may be controlled for more secure verification of the electrical connectivity between the two devices.

In addition, according to some example embodiments of the present disclosure, the apparatus 100 for verifying electrical connectivity may be manufactured with low manufacturing costs.

It should be understood that example embodiments described herein should be considered in a descriptive sense only and not for purposes of limitation. Descriptions of features or aspects within each embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope as defined by the following claims and their equivalents.

What is claimed is:

1. An apparatus for verifying electrical connectivity between a first device and a second device, the apparatus comprising:
   a signal generator configured to generate a first signal having a voltage waveform, under control of a processor;
   a second device connector configured to transmit the first signal to the second device and receive a second signal output from the second device in response to the first signal;
   a processor connector configured to transmit the first and second signals to the processor; and
   a current controller configured to control a magnitude of current such that the first signal has a given current value,
   wherein the processor is configured to verify the electrical connectivity between the first and second devices based on the first and second signals received through the processor connector.

2. The apparatus of claim 1, wherein the processor is configured to determine that the electrical connectivity between the first and second devices is verified in response to the first and second signals received through the processor connector corresponding to each other.

3. The apparatus of claim 2, wherein the first signal is a square-wave signal having a given period, and
   the processor is configured to determine that the electrical connectivity between the first and second devices is verified in response to the second signal being a square-wave signal having the given period.

4. The apparatus of claim 1, wherein the first signal is at least one of a square-wave signal having a given period and a linear signal having only a power supply voltage, and
   the processor is configured to determine that the first and second devices are in one of a state in which the first and second devices are electrically opened and a state in which the second device is shorted to ground in response to the second signal being a linear signal having only a ground voltage.

5. The apparatus of claim 1, wherein the first signal is a square-wave signal having a given period, and
   the processor is configured to determine that the second device is shorted to a power supply in response to the second signal being a linear signal having only a power supply voltage.

6. The apparatus of claim 1, wherein the second device connector comprises:
   a signal transmission unit configured to transmit the first signal to the second device; and
   a signal acquisition unit configured to acquire the second signal from the second device,
   wherein the second device is configured to form a first closed circuit having the signal transmission unit and the signal acquisition unit as a start point and an end point, respectively,
   wherein the first signal is enabled to be transmitted through a second closed circuit in which the signal generator, the signal transmission unit, the first closed circuit, the signal acquisition unit, and the current controller are connected in series to each other.

7. The apparatus of claim 6, wherein the current controller is configured to adjust a current value in the second closed circuit to be equal to the given current value in response to the first signal being transmitted through the second closed circuit.

8. The apparatus of claim 7, wherein the given current value is greater than a current value caused by noise in response to the first signal being transmitted through the second closed circuit.

9. The apparatus of claim 1, wherein
the first device is a battery pack, and
the second device is an electronic device configured to be driven by the battery pack,
wherein the apparatus is connected in parallel to the first device and in series to the second device through the second device connector.

10. The apparatus of claim 9, wherein, before the first device is connected to the second device, the apparatus is connected in series to the second device through the second device connector and is configured to verify the electrical connectivity between the first and second devices.

* * * * *